(12) United States Patent
Tanemura et al.

(10) Patent No.: US 11,302,970 B2
(45) Date of Patent: Apr. 12, 2022

(54) POWER SUPPLY SYSTEM

(71) Applicant: TOYOTA JIDOSHA KABUSHIKI KAISHA, Toyota (JP)

(72) Inventors: Kyosuke Tanemura, Nagakute (JP); Shuji Tomura, Nagakute (JP); Naoki Yanagizawa, Nagakute (JP); Kazuo Ootsuka, Nagakute (JP); Junta Izumi, Nagoya (JP); Kenji Kimura, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 109 days.

(21) Appl. No.: 16/657,969

(22) Filed: Oct. 18, 2019

(65) Prior Publication Data
US 2020/0136196 A1 Apr. 30, 2020

(30) Foreign Application Priority Data
Oct. 31, 2018 (JP) .............................. JP2018-204647

(51) Int. Cl.
*H01M 10/42* (2006.01)
*G01R 31/3842* (2019.01)
*H01M 10/44* (2006.01)
*H01M 10/48* (2006.01)

(52) U.S. Cl.
CPC .... *H01M 10/4207* (2013.01); *G01R 31/3842* (2019.01); *H01M 10/425* (2013.01); *H01M 10/441* (2013.01); *H01M 10/482* (2013.01)

(58) Field of Classification Search
CPC ........... H01M 10/4207; H01M 10/425; H01M 10/441; H01M 10/482; G01R 31/3842; G01R 31/389; G01R 31/396; Y02E 60/10; H02J 7/0013; H02J 7/0031; H02J 7/0016;
(Continued)

(56) References Cited

U.S. PATENT DOCUMENTS 7,443,139 B2 * 10/2008 Mitsui ................ G01R 31/3842
320/134
7,516,726 B2 * 4/2009 Esaka ................... H02J 7/0024
123/179.3
(Continued)

FOREIGN PATENT DOCUMENTS

JP H05188123 A 7/1993
JP 2010232104 A 10/2010
(Continued)

*Primary Examiner* — M Baye Diao
(74) *Attorney, Agent, or Firm* — Dickinson Wright, PLLC

(57) ABSTRACT

A power supply system includes a controller, and a plurality of battery modules. The battery modules are connected in series, according to a gate drive signal from the controller, to provide series connection, and each of the battery modules has a disconnecting device configured to force the battery module to be disconnected from the series connection. The controller is configured to estimate the internal resistance of the battery module disconnected from the series connection by the disconnecting device, from a module voltage of the battery module before the battery module is disconnected from the series connection, a module voltage immediately after the battery module is disconnected, and a module current delivered from the battery module.

2 Claims, 7 Drawing Sheets

(58) Field of Classification Search
CPC ...... H02J 7/0036; H02J 7/0045; H02J 7/0068; H02M 3/155
USPC .......................................................... 320/116
See application file for complete search history.

(56) References Cited

U.S. PATENT DOCUMENTS

| | | | | |
|---|---|---|---|---|
| 7,656,690 | B2* | 2/2010 | Yamada | B60L 15/007 |
| | | | | 363/71 |
| 8,654,495 | B2* | 2/2014 | Tinglow | H02J 7/0026 |
| | | | | 361/93.1 |
| 10,046,664 | B2* | 8/2018 | Komiyama | H02J 7/0063 |
| 10,084,323 | B2* | 9/2018 | Fetzer | B60L 58/18 |
| 10,193,357 | B2* | 1/2019 | Marinov | H02J 7/007 |
| 10,788,539 | B2* | 9/2020 | Miura | H02J 7/0029 |
| 2010/0121511 | A1* | 5/2010 | Onnerud | B60L 58/15 |
| | | | | 701/22 |
| 2012/0013304 | A1 | 1/2012 | Murase et al. | |
| 2013/0181514 | A1* | 7/2013 | Ikeda | B60L 58/15 |
| | | | | 307/10.1 |
| 2015/0194707 | A1* | 7/2015 | Park | H01M 10/4207 |
| | | | | 429/50 |
| 2020/0033415 | A1 | 1/2020 | Furukawa et al. | |
| 2020/0076206 | A1 | 3/2020 | Goto et al. | |
| 2021/0083485 | A1* | 3/2021 | Sung | H02J 7/0047 |

FOREIGN PATENT DOCUMENTS

| | | |
|---|---|---|
| JP | 2010-249770 A | 11/2010 |
| JP | 2011220695 A | 11/2011 |
| JP | 2014073051 A | 4/2014 |
| JP | 2018-074709 A | 5/2018 |
| WO | 2018062394 A1 | 4/2018 |
| WO | 2018/079664 A1 | 5/2018 |
| WO | 2018179774 A1 | 10/2018 |

* cited by examiner

POWER SUPPLY SYSTEM

INCORPORATION BY REFERENCE

The disclosure of Japanese Patent Application No. 2018-204647 filed on Oct. 31, 2018 including the specification, drawings and abstract is incorporated herein by reference in its entirety.

BACKGROUND

1. Technical Field

The disclosure relates to a power supply system in which battery modules are connected in series, to supply electric power.

2. Description of Related Art

A power supply system in which a plurality of battery modules is connected in series, to supply electric power (for power running) to a load, is used. When batteries included in the battery modules are secondary batteries, the batteries can be charged (regenerated) with power from the load side.

In the power supply system as described above, it has been proposed to provide each battery module with a switching circuit that connects and disconnects the battery module to and from the load, based on a gate drive signal. In this circuit arrangement, voltage control is performed by driving the switching circuit of each battery module, with the gate drive signal applied via a delay circuit (see Japanese Unexamined Patent Application Publication No. 2018-074709 (JP 2018-074709 A)).

Also, a method of computing the internal resistance of a secondary battery, which has a first stage and a second stage, is disclosed in Japanese Unexamined Patent Application Publication No. 2010-249770 (JP 2010-249770 A). In the first stage, the battery voltage and current of the secondary battery is repeatedly measured. In the second stage, the internal resistance of the secondary battery is calculated, using a battery voltage and a current value during charge and a battery voltage and a current value during discharge, at points in time estimated as the same time, with reference to a switching point between charge and discharge of the secondary battery when the absolute value of the current gradually increases during discharge or charge after the absolute value of the current gradually decreases during charge or discharge.

SUMMARY

In the power supply system, it is desirable to be able to measure the internal resistance of the battery included in each of the battery modules, with high accuracy, so as to be aware of deterioration conditions, etc. of the battery. However, the manufacturing cost of the power supply system will increase if a current sensor is provided for each battery module so as to measure the internal resistance of the battery.

A first aspect of the disclosure provides a power supply system. The power supply system includes a controller, and a plurality of battery modules each having a secondary battery. The battery modules are configured to be connected in series, according to a gate drive signal from the controller, to provide series connection, and each of the battery modules has a disconnecting device configured to force the battery module to be disconnected from the series connection. The controller is configured to estimate an internal resistance of the battery module disconnected from the series connection by the disconnecting device, from a module voltage of the battery module before the battery module is disconnected from the series connection, a module voltage immediately after the battery module is disconnected, and a module current delivered from the battery module.

A second aspect of the disclosure provides another power supply system. The power supply system includes a controller, and a plurality of battery modules each having a secondary battery. The battery modules are configured to be connected in series, according to a gate drive signal from the controller, to provide series connection, and each of the battery modules has a disconnecting device configured to force the battery module to be disconnected from the series connection. The controller is configured to estimate an internal resistance of the battery module connected to the series connection, from a module voltage of the battery module before the battery module is connected to the series connection from a state in which the battery module is disconnected from the series connection by the disconnecting device, a module voltage immediately after the battery module is connected to the series connection, and a module current delivered from the battery module.

In the power supply system of each of the first and second aspects, the controller may be configured to estimate the module current, from an output current delivered from the power supply system and an ON-duty set for the battery module.

In the power supply system of the first aspect, the controller may be configured to estimate the internal resistance, from an absolute value of a difference between the module voltage before the battery module is disconnected from the series connection by the disconnecting device, and the module voltage immediately after the battery module is disconnected from the series connection, and the module current.

In the power supply system of the second aspect, the controller may be configured to estimate the internal resistance from an absolute value of a difference between the module voltage before the battery module is connected to the series connection from the state in which the battery module is disconnected from the series connection by the disconnecting device, and the module voltage immediately after the battery module is connected to the series connection, and the module current.

According to this disclosure, it is possible to measure the internal resistance of the battery included in each battery module with high accuracy, without providing a current sensor for each battery module.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
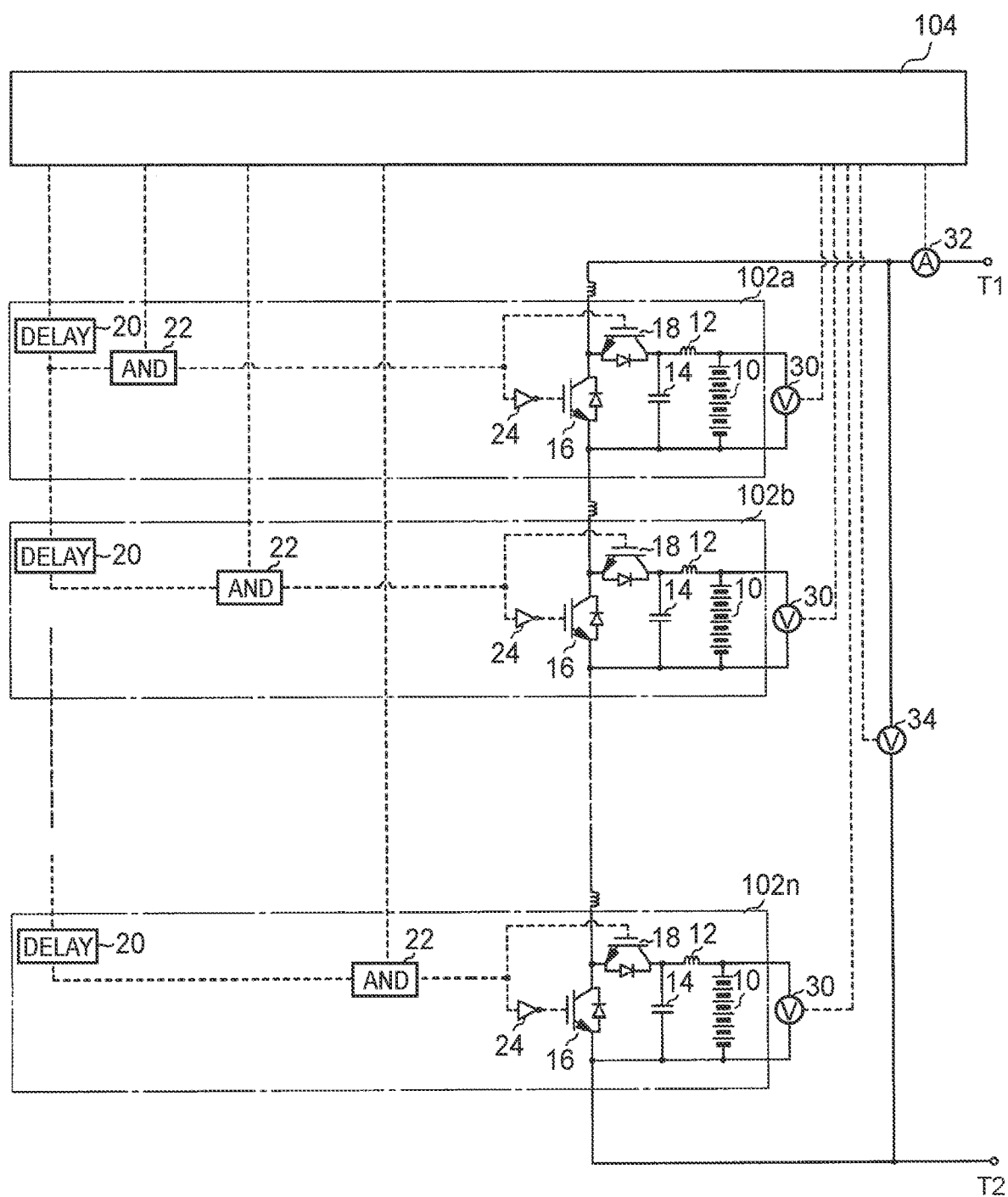
FIG. 1 is a view showing the configuration of a power supply system according to one embodiment of the disclosure.

As shown in FIG. 1, a power supply system 100 according to one embodiment includes a plurality of battery modules 102 (102a, 102b, . . . , 102n) and a controller 104. The battery modules 102 can be connected in series under control of the controller 104. The battery modules 102 included in the power supply system 100 can supply electric power (for power running) to a load (not shown) connected to terminals T1 and T2, or can be charged (regenerated) with electric power from a power supply (not shown) connected to the terminals T1 and T2.

Each of the battery modules 102 includes a battery 10, choke coil 12, capacitor 14, first switch element 16, second switch element 18, delay circuit 20, AND element 22, and NOT element 24. In this embodiment, each battery module 102a, 102b, . . . , 102n has the same configuration.

The battery 10 includes at least one secondary cell. The battery 10 is composed of a plurality of lithium-ion cells, nickel-hydrogen cells, or the like, connected in series and/or in parallel, for example. The choke coil 12 and the capacitor 14 constitute a smoothing circuit (low-pass filter circuit) that smooths and delivers output from the battery 10. Since one or more secondary cells are used in the battery 10, an RLC filter is formed by the battery 10, choke coil 12 and capacitor 14, for smoothing of current, so as to curb deterioration of the battery 10 due to increase of an internal resistance loss.

The choke coil 12 and the capacitor 14 are not essential components, and may not be provided. In the battery module 102, the positions at which the choke coil 12 and the battery 10 are placed (connected) may be switched with each other. Also, the second switch element 18 may be placed on the opposite side of the output terminals with respect to the first switch element 16. Namely, the arrangement of respective elements and electric components may be changed as appropriate, provided that the voltage of the battery 10 (capacitor 14) can be applied to the output terminals, through switching operation of the first switch element 16 and the second switch element 18.

The first switch element 16 includes a switching device for short-circuiting the output ends of the battery 10. In this embodiment, the first switch element 16 is configured such that a freewheeling diode is connected in parallel with a field-effect transistor as the switching device. The second switch element 18 is placed between the battery 10 and the first switch element 16, and is connected in series with the battery 10. In this embodiment, the second switch element 18 is configured such that a freewheeling diode is connected in parallel with a field-effect transistor as a switching device. Switching of the first switch element 16 and the second switch element 18 is controlled according to a gate signal (gate drive signal) from the controller 104. While the field-effect transistors are used as the first switch element 16 and the second switch element 18 in this embodiment, switching devices other than the field-effect transistors may be used.

The delay circuit 20 serves to delay the gate signal transmitted from the controller 104 to each battery module 102, by a predetermine time. In the power supply system 100, each of the battery modules 102a, 102b, . . . , 102n is provided with the delay circuit 20, and the delay circuits 20 of the respective battery modules 102 are connected in series. Accordingly, the gate signal received from the controller 104 is sequentially applied to the battery modules 102a, 102b, . . . , 102n, while being delayed by the predetermined time in each battery module.

The AND element 22 constitutes a disconnecting device that forcedly disconnects the corresponding battery module 102 from the series-connected state, according to a forced disconnection signal. The AND element 22 is controlled in response to the forced disconnection signal from the controller 104. The AND element 22 has one input terminal that receives a control signal from the controller 104, and the other input terminal that receives the gate drive signal from the delay circuit 20. An output signal from the AND element 22 is transmitted to a gate terminal of the second switch element 18. The output signal from the AND element 22 is also transmitted to a gate terminal of the first switch element 16 via the NOT element 24.

Under normal control, the controller 104 sends a high(H)-level control signal to the AND element 22. Accordingly, the gate drive signal is transmitted as it is to the gate terminal of the second switch element 18, and an inversion signal of the gate drive signal is transmitted to the gate terminal of the first switch element 16. As a result, when the gate drive signal is at a high (H) level, the first switch element 16 is placed in the OFF state, and the second switch element 18 is placed in the ON state. When the gate drive signal is at a low (L) level, the first switch element 16 is placed in the ON state, and the second switch element 18 is placed in the OFF state. Namely, the battery module 102 to which the high (H)-level gate drive signal is applied is connected in series with the other battery modules 102, and the battery module 102 to which the low(L)-level gate drive signal is applied is disconnected from the other battery modules 102, and placed in a through state.

At the time of forced disconnection, the controller 104 sends a low(L)-level control signal to the AND element 22. As a result, a low(L)-level signal is generated from the AND element 22, and a high(H)-level signal is received by the gate terminal of the first switch element 16 via the NOT element 24, while the low(L)-level signal is received by the gate terminal of the second switch element 18. Accordingly, the first switch element 16 is placed in the ON state all the time, and the second switch element 18 is placed in the OFF state all the time, so that the battery module 102 is placed in a state (path-through state) in which it is forced to be disconnected from series connection, irrespective of the level of the gate drive signal.

The forced disconnection control as described above may be used as control for reducing imbalance of the SOC among the battery modules 102 in the power supply system 100, and may be used for disconnection of a battery module when it fails. Namely, when the power supply system 100 is in a state of discharge, the SOC of the battery modules 102 involved in output of the power supply system 100 is reduced. However, if any of the battery modules 102 is brought into a forced disconnected state, the SOC of the battery module 102 can be kept at the same level. Also, when the power supply system 100 is in a state of charge, the SOC of the battery modules 102 involved in charging of the power supply system 100 is increased. However, if any of the battery modules 102 is brought into the forced disconnected state, the SOC of the battery module 102 can be kept at the same level.

While the delay circuit 20 is placed in the preceding stage of the AND element 22 in this embodiment, it may be placed in the trailing stage of the AND element 22. Namely, any arrangement may be employed provided that the gate signal, which is delayed by a predetermined time in each battery module 102, is sequentially transmitted to the delay circuits 20 of the downstream battery modules 102.

Normal Control

Figure 2:
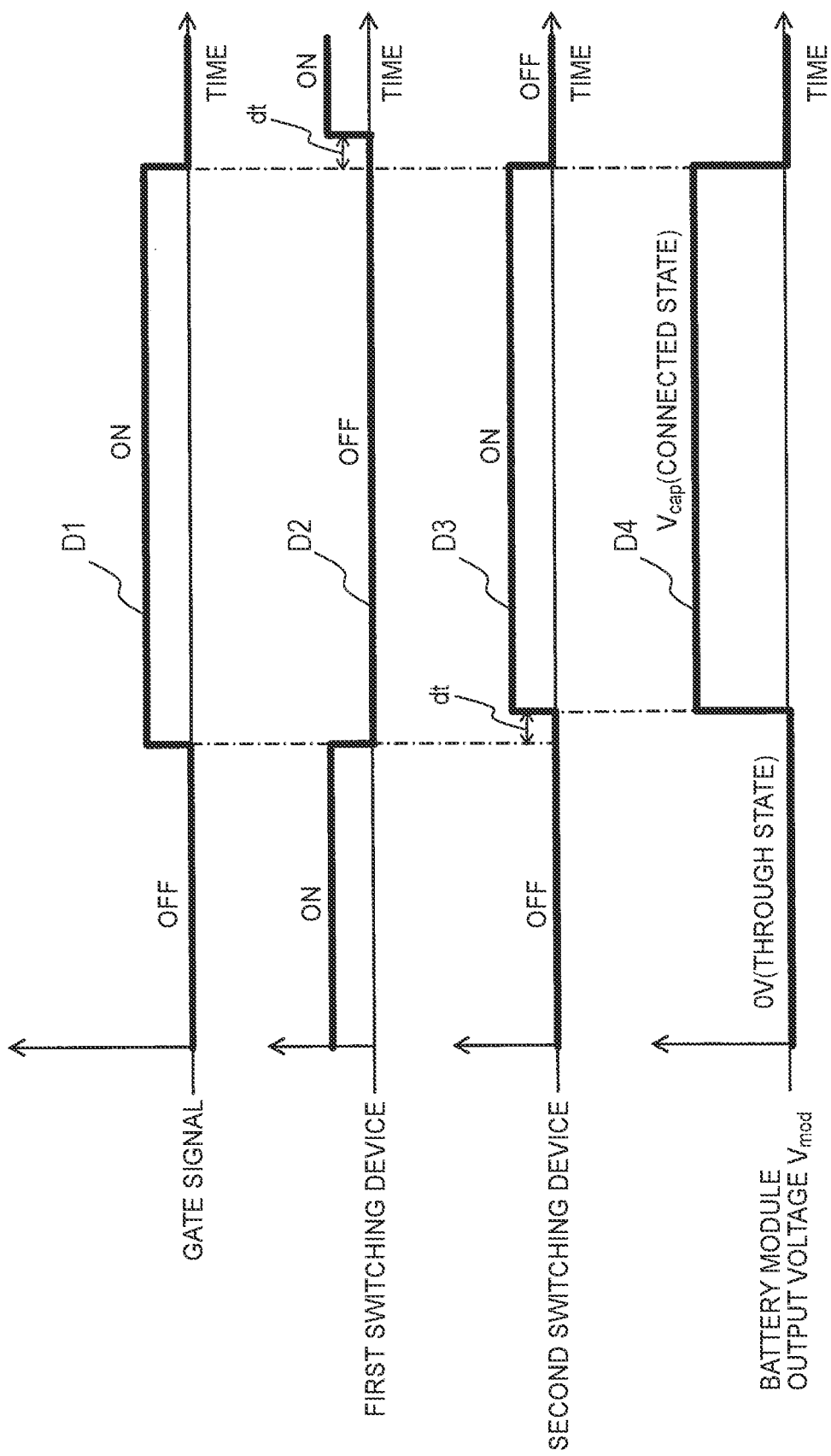
FIG. 2 is a time chart useful for describing control of a battery module in the embodiment of the disclosure.

Referring to FIG. 2, control of the power supply system 100 will be described. Under normal control, the high(H)-level control signal is transmitted from the controller 104 to the AND element 22 of each of the battery modules 102a, 102b, ..., 102n. Accordingly, the gate terminal of the first switch element 16 receives an inversion signal of the output signal from the delay circuit 20 via the NOT element 24, and the gate terminal of the second switch element 18 receives the output signal from the delay circuit 20 as it is.

The time chart of FIG. 2 is concerned with operation of the battery module 102a. FIG. 2 shows pulse waveform of the gate signal D1 that drives the battery module 102a, rectangular wave D2 indicating a switching state of the first switch element 16, rectangular wave D3 indicating a switching state of the second switch element 18, and waveform D4 of output voltage Vmod of the battery module 102a.

In the initial state of the battery module 102a, namely, in a condition where no gate signal is generated, the first switch element 16 is in the ON state, and the second switch element 18 is in the OFF state. Then, when a gate signal is transmitted from the controller 104 to the battery module 102a, switching control in the form of PWM control is performed on the battery module 102a. Under the switching control, the first switch element 16 and the second switch element 18 are alternately placed in the ON state and the OFF state.

As shown in FIG. 2, when the gate signal D1 is generated from the controller 104, the first switch element 16 and second switch element 18 of the battery module 102a are driven, according to the gate signal D1. The first switch element 16 is switched from the ON state to the OFF state, in response to a fall of the signal from the NOT element 24 responsive to a rise of the gate signal D1. Also, the first switch element 16 is switched from the OFF state to the ON state, with a slight time delay (dead time dt) from a fall of the gate signal D1.

On the other hand, the second switch element 18 is switched from the OFF state to the ON state, with a slight time delay (dead time dt) from a rise of the gate signal D1. Also, the second switch element 18 is switched from the ON state to the OFF state, at the same time as a fall of the gate signal D1. Thus, the first switch element 16 and the second switch element 18 are controlled so as to be alternately switched between the ON state and the OFF state.

The first switch element 16 operates with a slight time delay (dead time dt) upon a fall of the gate signal D1, and the second switch element 18 operates with a slight time delay (dead time dt) upon a rise of the gate signal D1, so that the first switch element 16 and the second switch element 18 are prevented from operating at the same time. Namely, the first switch element 16 and the second switch element 18 are prevented from being turned ON at the same time and short-circuited. The dead time dt for which the operation is delayed is set to 100 ns, for example, but may be set as appropriate. During the dead time dt, current flows backward through a diode, so that the switch element is brought into the same condition as that in which the switching device disposed in parallel with the diode is turned ON.

Figure 3A:
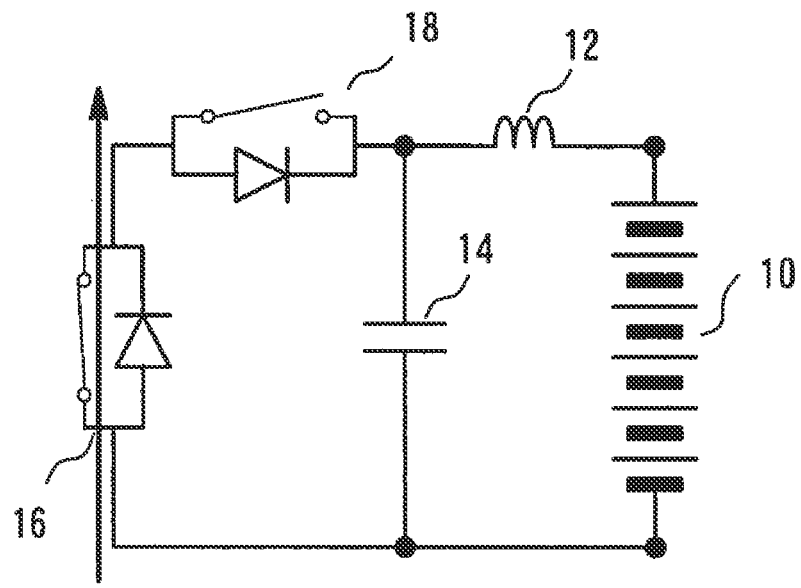
FIG. 3A is a view showing one example of operation of the battery module in the embodiment of the disclosure.

Through the above control, when the gate signal D1 applied to the battery module 102a is OFF (namely, when the first switch element 16 is ON, and the second switch element 18 is OFF), the capacitor 14 is disconnected from the output terminals of the battery module 102a. Accordingly, no voltage is applied from the battery module 102a to the output terminals. In this condition, the battery module 102a is placed in a through state in which the battery 10 (capacitor 14) of the battery module 102a is bypassed, as shown in FIG. 3A.

Figure 3B:
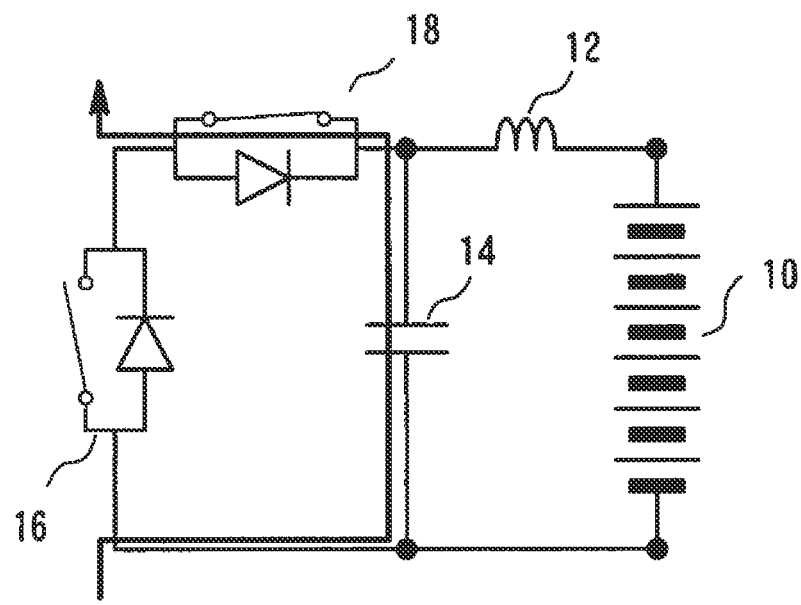
FIG. 3B is a view showing another example of operation of the battery module in the embodiment of the disclosure.

When the gate signal D1 is ON (namely, when the first switch element 16 is OFF, and the second switch element 18 is ON), the capacitor 14 is connected to the output terminals of the battery module 102a. Accordingly, a voltage is applied from the battery module 102a to the output terminals. In this conditions, the voltage Vmod is applied to the output terminals via the capacitor 14 in the battery module 102a, as shown in FIG. 3B.

Referring back to FIG. 1, control of the power supply system 100 by means of the controller 104 will be described. The controller 104 controls the whole set of the battery modules 102. Namely, the controller 104 controls a plurality of battery modules 102a, 102b, ..., 102n, so as to control the output voltage of the power supply system 100.

The controller 104 includes a gate circuit that generates a gate signal in the form of rectangular wave, to each battery module 102. The gate signal is sequentially transmitted to the battery modules 102 of the downstream stages, via the delay circuit 20 included in the battery module 102a, delay circuit 20 included in the battery module 102b, and so forth. Namely, the gate signal is sequentially transmitted from the most upstream side of the battery modules 102 connected in series in the power supply system 100, to the downstream side, while being delayed by a predetermined delay time in each battery module.

Under normal control, the high(H)-level control signal is applied from the controller 104 to the AND element 22; therefore, the gate signal delivered from the delay circuit 20 of each battery module 102 is applied as it is to the gate terminal of the second switch element 18, and a signal obtained by inverting the gate signal is applied to the gate terminal of the first switch element 16. Accordingly, when the gate signal is at the high (H) level, the first switch element 16 is placed in the OFF state, and the second switch element 18 is placed in the ON state. When the gate signal is at the low (L) level, the first switch element 16 is placed in the ON state, and the second switch element 18 is placed in the OFF state.

Namely, the battery module 102 to which the high(H)-level gate signal is applied is placed in a state in which it is connected in series with the other battery modules 102, and the battery module 102 to which the low(L)-level gate signal is applied is placed in a through state in which it is disconnected from the other battery modules 102.

Figure 4:
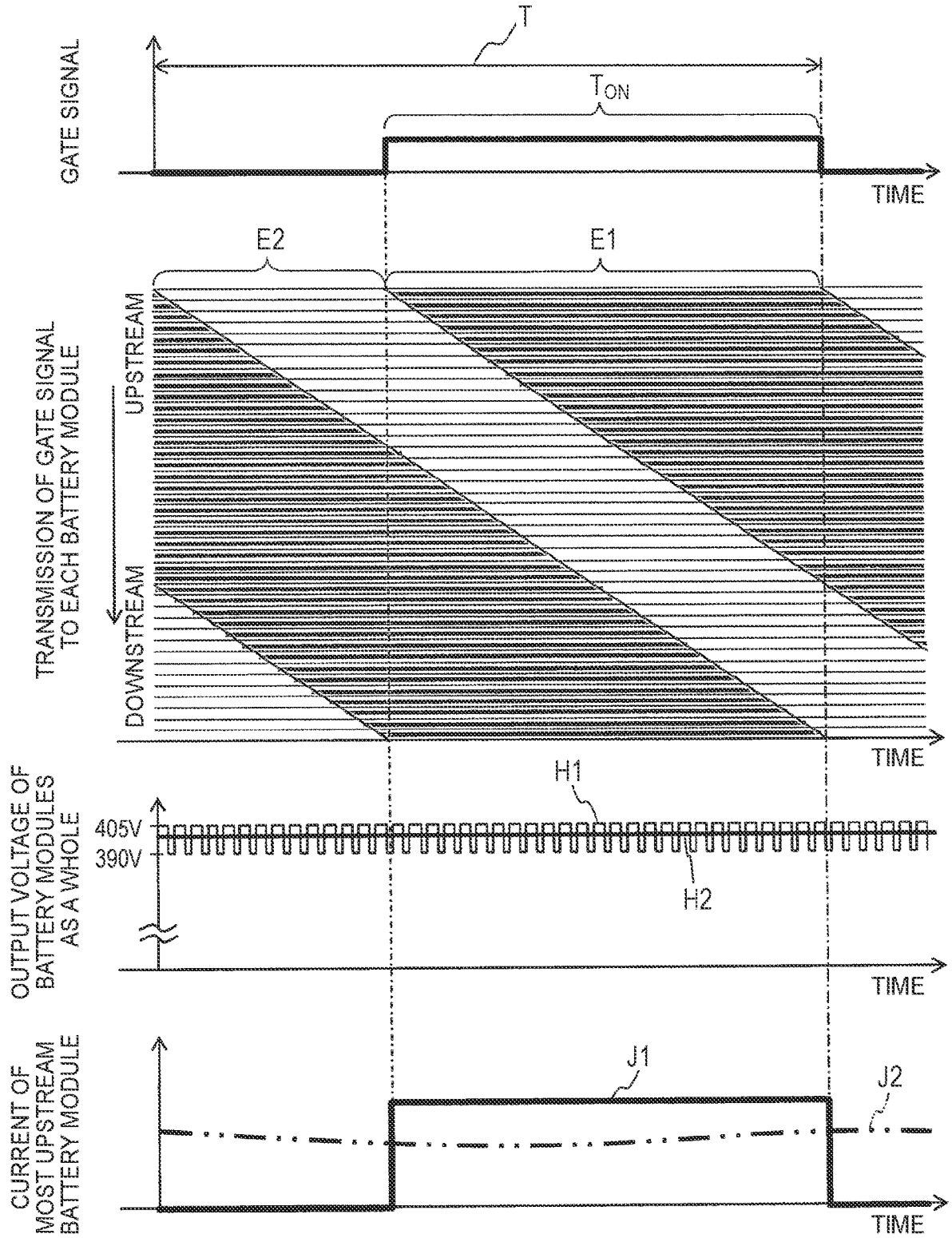
FIG. 4 is a time chart useful for describing control of the power supply system in the embodiment of the disclosure.

FIG. 4 shows a control sequence according to which a given number of the battery modules 102a, 102b, ..., 102n are sequentially connected in series, to deliver electric power. As shown in FIG. 4, in response to the gate signal, the battery modules 102a, 102b, ..., 102n are driven one after another from the upstream side to the downstream side, with a fixed delay time. In FIG. 4, period E1 indicates a state (connected state) in which the first switch elements 16 of the battery modules 102a, 102b, ..., 102n are OFF, and the second switch elements 18 are ON, so that voltage is generated from the output terminals of the battery modules 102a, 102b, ..., 102n. Also, period E2 indicates a state (through state) in which the first switch elements 16 of the battery modules 102a, 102b, ..., 102n are ON, and the second switch elements 18 are OFF, so that no voltage is generated from the output terminals of the battery modules 102a, 102b, . . . , 102n. Thus, the battery modules 102a, 102b, . . . , 102n are sequentially driven with the fixed delay time.

Referring to FIG. 4, the manner of setting the gate signal and the delay time of the gate signal will be described. The period T of the gate signal is set by adding the delay times of the battery modules 102a, 102b, . . . , 102n together. Thus, the frequency of the gate signal is lower as the delay time is set to be longer. Conversely, the frequency of the gate signal is higher as the delay time is set to be shorter. The delay time by which the gate signal is delayed is set as appropriate, according to the specifications required of the power supply system 100.

The ON-time ratio D (ON-duty D) in the period T of the gate signal, namely, the ratio of time TON for which the gate signal is at the high (H) level, to the period T, is calculated by dividing the output voltage of the power supply system 100 by the total voltage of the battery modules 102a, 102b, . . . , 102n, i.e., (output voltage of the power supply system 100)/(total voltage of the battery modules 102a, 102b, . . . , 102n). Namely, the ON-time ratio D=(output voltage of the power supply system 100)/(the battery voltage of the battery module 102×the total number of the battery modules 102). In a precise sense, the ON-time ratio varies due to the dead time dt; therefore, it is preferable to correct the ON-time ratio in a feedback or feedforward manner, as generally performed by a chopper circuit.

As described above, the output voltage of the power supply system 100 is represented by a value obtained by multiplying the battery voltage of each battery module 102 by the number of the battery modules 102 that are in the connected state. When the output voltage of the power supply system 100 is a value that can be exactly divided by the battery voltage of one battery module 102, some battery modules 102 are switched from the connected state to the through state, at the moment when other battery modules 102 are switched from the through state to the connected state. Thus, there is no variation in the output voltage of the battery modules 102 as a whole.

However, when the output voltage of the power supply system 100 is a value that cannot be exactly divided by the battery voltage of each battery module 102, the output voltage of the power supply system 100 (the overall output voltage) varies. In this case, the variable amplitude is the voltage of one battery module, and the variable period is obtained by dividing the period T of the gate signal by the total number of the battery modules 102. When several dozens of battery modules 102 are connected in series, the parasitic inductance of the power supply system 100 as a whole becomes a large value, and the voltage variation is filtered out, so that a stable output voltage of the power supply system 100 can be eventually obtained.

Next, a specific example will be described. In FIG. 4, it is assumed that a desired output voltage of the power supply system 100 is 400 V, the battery voltage of each battery module 102 is 15V, the total number of the battery modules 102a, 102b, . . . , 102n is 40, and the delay time is 200 ns. In this case, the output voltage (400V) of the power supply system 100 cannot be exactly divided by the battery voltage (15V) of the battery module 102.

The period T of the gate signal is calculated by multiplying the delay time by the total number of the battery modules 102; thus, the period T is 8 µs (=200 ns×40), based on the above numerical values. Accordingly, the gate signal is in the form of rectangular wave having a frequency of 125 kHz. Also, the ON-time ratio D of the gate signal is calculated by dividing the output voltage of the power supply system 100 by (battery voltage of the battery module 102×the total number of the battery modules 102); thus the ON-time ratio D becomes substantially equal to 0.67, namely, 400 V/(15 V×40)≈0.67.

When the battery modules 102a, 102b, . . . , 102n are sequentially driven, based on these numerical values, the output voltage H1 in the form of rectangular wave is provided by the power supply system 100, as shown in FIG. 4. The output voltage H1 varies between 390 V and 405 V. Namely, the output voltage H1 varies at intervals of a period T calculated by dividing the period T of the gate signal by the total number of the battery modules, namely, at intervals of 200 ns (=8 µs/40) (corresponding to 5 MHz). This variation is filtered out by the parasitic inductance caused by wirings of the battery modules 102a, 102b, . . . , 102n, and the power supply system 100 as a whole delivers an output voltage H2 of about 400 V.

In this connection, electric current flows to the capacitor 14 of each battery module 102 when the battery module 102 is in the connected state, and the capacitor current waveform J1 becomes rectangular wave, as shown in FIG. 4. Also, since the battery 10 and the capacitor 14 form the RLC filter, current J2 that has been filtered and smoothed flows in the power supply system 100. Thus, the current waveform is uniform over all of the battery modules 102a, 102b, . . . , 102n, and current can be evenly delivered from all of the battery modules 102a, 102b, . . . , 102n.

As described above, when the power supply system 100 is controlled, the gate signal applied to the most upstream battery module 102a is applied with a delay of a given time, to the downstream battery module 102b, and the gate signal is further sequentially transmitted to the downstream battery modules 102 with the delay of the given time for each module, so that the battery modules 102a, 102b, . . . , 102n sequentially deliver voltages, with the delay of the given time. Then, these voltages are added up, to provide the voltage of the power supply system 100. In this manner, the desired voltage can be delivered from the power supply system 100.

In the power supply system 100, no booster circuit is required, and the circuit configuration can be simplified, so that the size and the cost can be reduced. Also, a balance circuit, or the like, which causes a power loss is not required, and the efficiency of the power supply system 100 can be enhanced. Further, voltage is substantially equally or evenly delivered from the battery modules 102a, 102b, . . . , 102n; therefore, driving is not concentrated on a particular battery module or modules 102, and an internal resistance loss of the power supply system 100 can be reduced.

Also, the desired voltage can be easily provided by adjusting the ON-time ratio D, and the versatility of the power supply system 100 can be improved. In particular, even when a failure occurs in one of the battery modules 102a, 102b, . . . , 102n, and it becomes difficult to use the battery module 102, the desired voltage can obtained by excluding the faulty battery module 102, using normal battery modules 102, and resetting the period T of the gate signal, ON-time ratio D, and delay time. Namely, even when a failure occurs in any of the battery modules 102a, 102b, . . . , 102n, the desired voltage can be kept generated.

Further, the frequency of the gate signal becomes lower as the delay time by which the gate signal is delayed is set to be longer; as a result, the switching frequencies of the first switch element 16 and the second switch element 18 are lowered, and the switching loss can be reduced, so that the power conversion efficiency can be improved. Conversely, the frequency of the gate signal becomes higher as the delay time by which the gate signal is delayed is set to be shorter; as a result, the frequency of voltage variation becomes higher, which makes filtering easy, and a stable voltage can be obtained. Also, the use of the RLC filter makes it easy to smooth or level current variations. Thus, it is possible to provide the power supply system 100 according to the required specifications and performance, by adjusting the delay time by which the gate signal is delayed.

Internal Resistance Measurement Process

Figure 5:
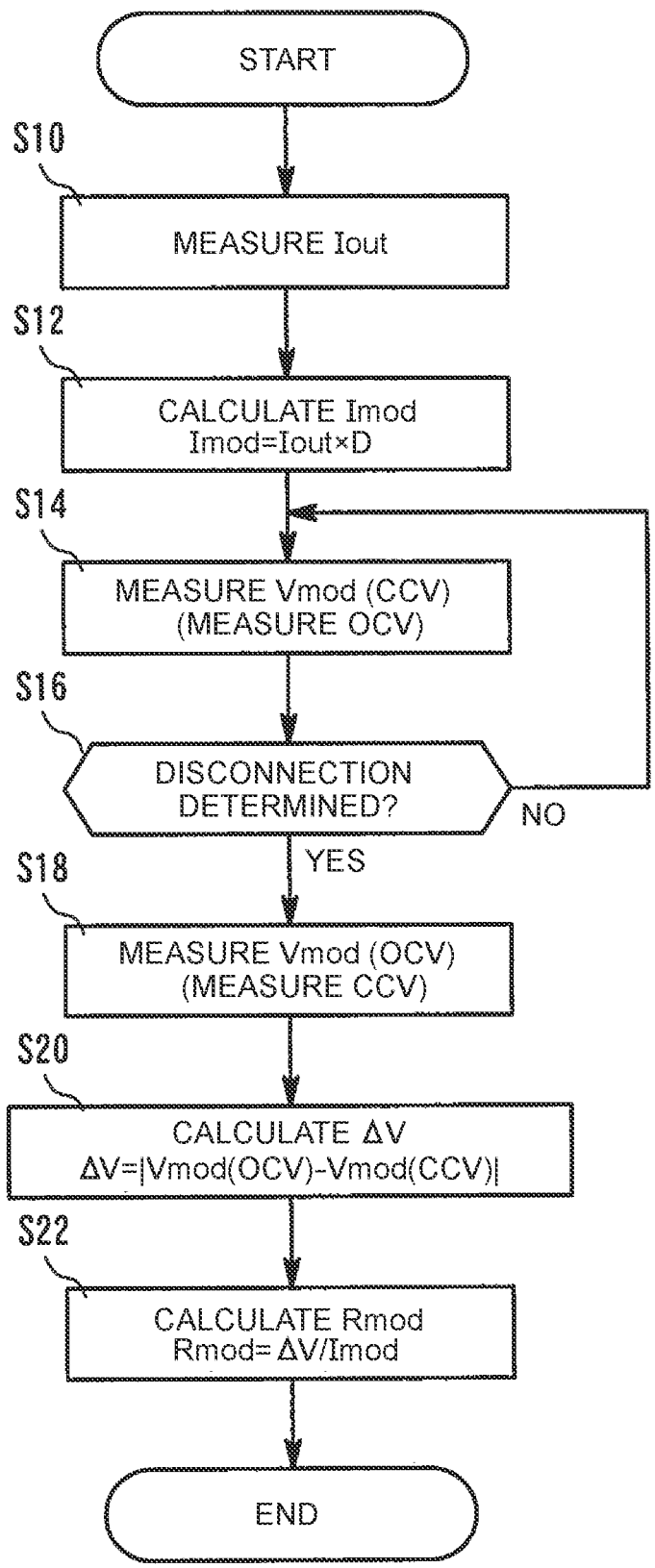
FIG. 5 is a flowchart illustrating a process of estimating the internal resistance in the embodiment of the disclosure.

FIG. 5 is a flowchart of an internal resistance measurement process of the battery module 102 according to this embodiment. Referring to FIG. 5, the internal resistance measurement process of the battery module 102 will be described.

In step S10, an output current Iout from the power supply system 100 is measured. The controller 104 obtains a measurement value of the output current Iout, from a current sensor 32 provided in an output line of the power supply system 100.

Figure 6:
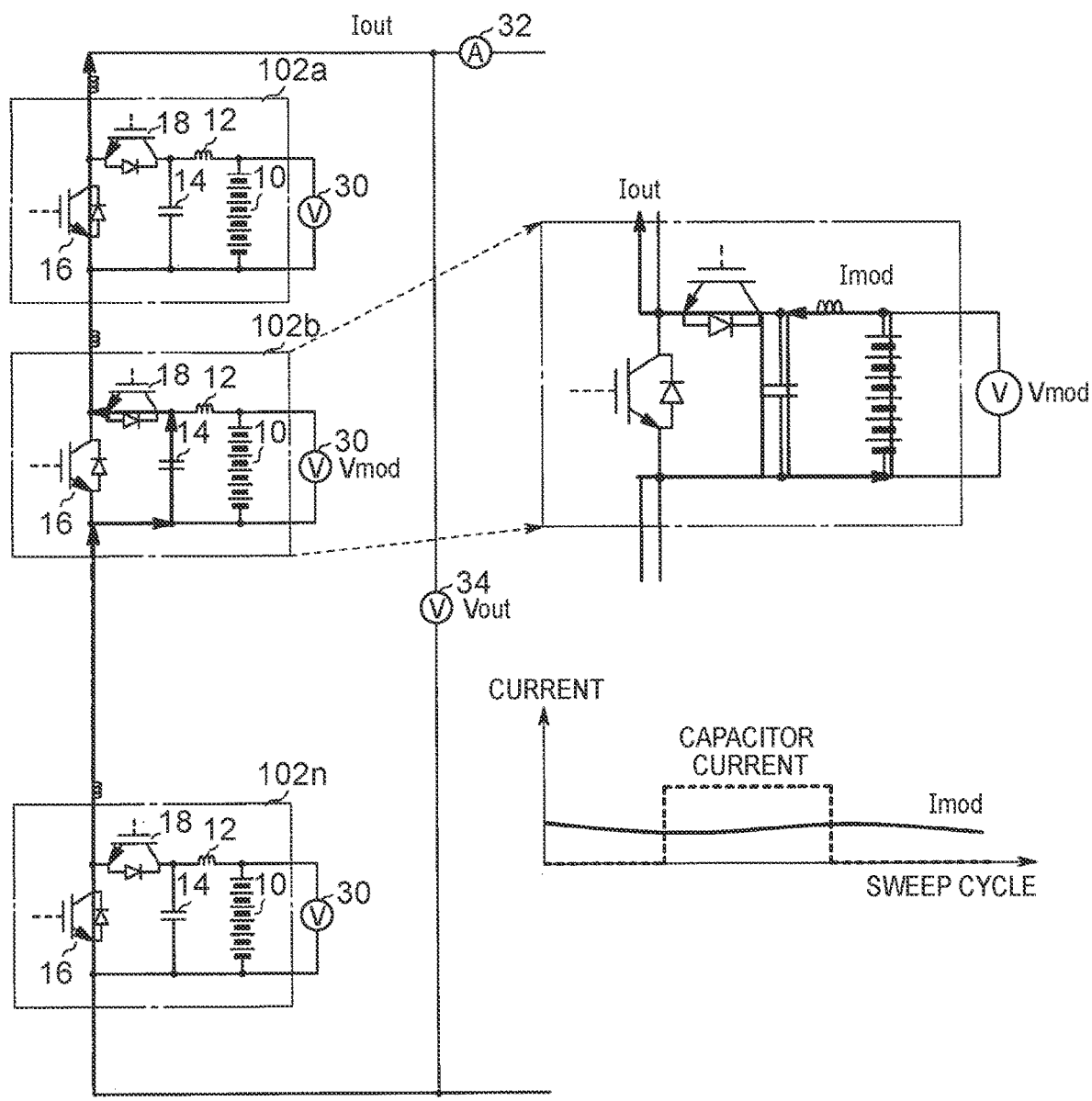
FIG. 6 is a view useful for describing module current in the embodiment of the disclosure.

In step S12, the module current Imod of the battery modules 102 is calculated. As shown in FIG. 6, the module current Imod in each battery module 102 is equal to a value of current delivered during the ON time of the ON-time ratio D (ON-duty D) so that the output current Iout is generated by the battery modules 102 connected in series; thus, the module current Imod is obtained by multiplying the output current Iout by the ON-time ratio D (ON-duty D), as indicated by Eq. (1) below.

$$I\,\text{mod}=I\text{out}\times D \tag{1}$$

In the power supply system 100, the module current Imod is calculated according to the relationship between the output current Iout of the power supply system 100 and the ON-time ratio D (ON-duty D). Accordingly, there is no need to provide a current sensor in each battery module 102, and the manufacturing cost of the power supply system 100 can be reduced.

In step S14, the module voltage Vmod of the battery module 102 is measured. The controller 104 obtains a measurement value of the module voltage Vmod, from a voltage sensor 30 provided in each battery module 102 of the power supply system 100. Here, the module voltage Vmod (connection voltage CCV) of each battery module 102 that is not forced to be disconnected is measured.

In step S16, a process of disconnecting a certain battery module 102 and a disconnection determining process are performed. The controller 104 places the battery module 102 of which the internal resistance Rmod is to be measured, in a forcedly disconnected state. More specifically, the controller 104 applies a low(L)-level control signal, to the AND element 22 of the battery module 102 as an object of forced disconnection. As a result, the battery module 102 as the object of forced disconnection is disconnected from series connection. The controller 104 proceeds to step S18 when the battery module 102 is disconnected, and returns to step S14 if not.

In step S18, the module voltage Vmod of the battery module 102 is measured. The controller 104 obtains a measurement value of the module voltage Vmod, from the voltage sensor 30 provided in each battery module 102 of the power supply system 100. Here, the module voltage Vmod (open-circuit voltage OCV) of each battery module 102 immediately after it was forced to be disconnected is measured. A time difference between prior to disconnection and immediately after disconnection may be set to about 10 µs, for example.

Figure 7:
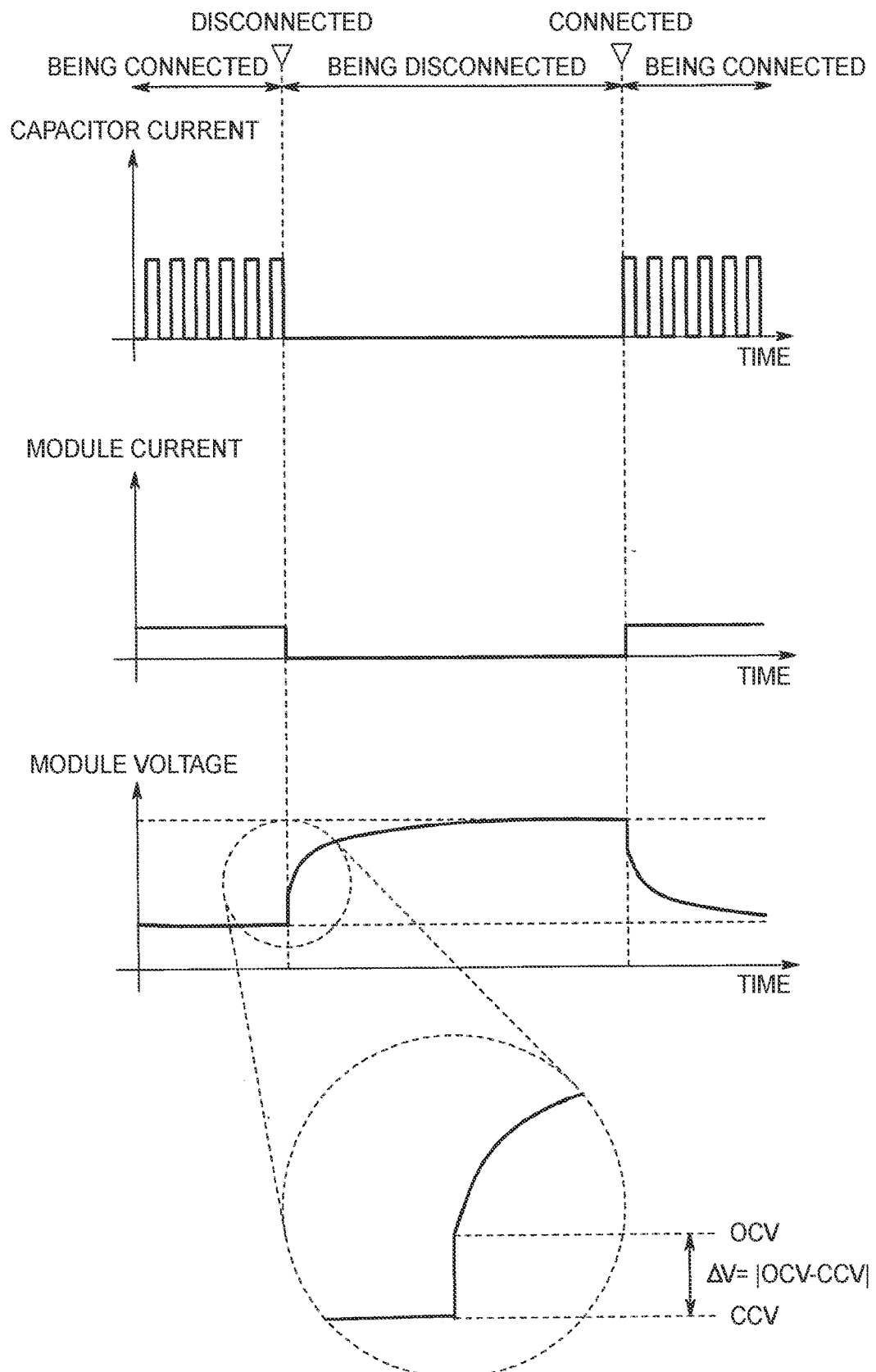
FIG. 7 is a view useful for describing module voltage in the embodiment of the disclosure.

In step S20, a potential difference ΔV is calculated. As shown in FIG. 7, in the module voltage Vmod of the battery module 102, a potential difference ΔV appears between the connection voltage CCV prior to disconnection, and the open-circuit voltage OCV immediately after disconnection. The controller 104 calculates an absolute value of a difference between the module voltage Vmod (open-circuit voltage OCV) measured in step S18 and the module voltage Vmod (connection voltage CCV) measured in step S14, as the potential difference ΔV, using Eq. (2) as follows.

$$\Delta V=|V\,\text{mod}(\text{OCV})-V\,\text{mod}(\text{CCV})| \tag{2}$$

In step S22, the internal resistance Rmod of the battery module 102 is calculated. The potential difference ΔV represents a voltage drop caused by the internal resistance Rmod of the battery 10 included in the battery module 102. Accordingly, the potential difference ΔV is expressed by Eq. (3) as follows.

$$\Delta V=I\,\text{mod}\times R\,\text{mod} \tag{3}$$

Eq. (4) below is obtained by modifying Eq. (3) above. The controller 104 calculates the internal resistance Rmod of the battery module 102, according to Eq. (4).

$$R\,\text{mod}=\Delta V/I\,\text{mod} \tag{4}$$

In the manner as described above, the internal resistance Rmod of the battery module 102 can be obtained. The internal resistance Rmod can also be estimated even during operation of the power supply system 100. In this embodiment, the current can be reduced in steps to zero, and the potential difference ΔV due to the internal resistance Rmod of the battery 10 can be accurately measured. Thus, the internal resistance Rmod can also be estimated with high accuracy.

Further, according to the power supply system 100 of this embodiment, it is possible to obtain the internal resistance Rmod of each of the battery modules 102, without providing a current sensor in each battery module 102.

The relationship between a combination of the module current Imod and the potential difference ΔV, and the internal resistance Rmod, may be examined in advance, and stored in a storage that can be accessed from the controller 104, so that the internal resistance Rmod can be obtained by measuring the module current Imod and the potential difference ΔV.

In this embodiment, the module voltage Vmod (connection voltage CCV) is measured in step S14 of FIG. 5, and the module voltage Vmod (open-circuit voltage OCV) is measured in step S18. However, these steps may be reversed. Namely, when the battery module 102 is brought from the forcedly disconnected state into the connected state, a potential difference ΔV between prior to the connection and immediately after the connection may be obtained. With this method, too, the internal resistance Rmod can be estimated.

What is claimed is:

1. A power supply system comprising:
a controller; and
a plurality of battery modules each having a secondary battery, the battery modules being configured to be connected in series, according to a gate drive signal from the controller, to provide series connection, each of the battery modules having a disconnecting device configured to force the battery module to be disconnected from the series connection,
wherein the controller is configured to sequentially connect each of the battery modules to a current sensor, estimate an internal resistance of each battery module disconnected from the series connection by the disconnecting device, from a module voltage of the battery module before the battery module is disconnected from the series connection, a module voltage immediately after the battery module is disconnected, and a module current delivered from the battery module;

wherein the controller is configured to estimate the module current, from an output current delivered from the power supply system and an ON-duty set for the battery module; and wherein the controller is configured to estimate the internal resistance, from an absolute value of a difference between the module voltage before the battery module is disconnected from the series connection by the disconnecting device, and the module voltage immediately after the battery module is disconnected from the series connection, and the module current.

2. A power supply system comprising:

a controller; and a plurality of battery modules each having a secondary battery, the battery modules being configured to be connected in series, according to a gate drive signal from the controller, to provide series connection, each of the battery modules having a disconnecting device configured to force the battery module to be disconnected from the series connection, wherein the controller is configured to sequentially connect each of the battery modules to a current sensor, estimate an internal resistance of each battery module connected to the series connection, from a module voltage of the battery module before the battery module is connected to the series connection from a state in which the battery module is disconnected from the series connection by the disconnecting device, a module voltage immediately after the battery module is connected to the series connection, and a module current delivered from the battery module;

wherein the controller is configured to estimate the module current, from an output current delivered from the power supply system and an ON-duty set for the battery module; and wherein the controller is configured to estimate the internal resistance from an absolute value of a difference between the module voltage before the battery module is connected to the series connection from the state in which the battery module is disconnected from the series connection by the disconnecting device, and the module voltage immediately after the battery module is connected to the series connection, and the module current.

* * * * *